United States Patent
Behzad et al.

(10) Patent No.: US 7,545,856 B2
(45) Date of Patent: *Jun. 9, 2009

(54) CURRENT MODE PHASE SHIFTER, MIXER AND AMPLIFIER

(75) Inventors: Arya Reza Behzad, Poway, CA (US); Ali Afsahi, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 564 days.

This patent is subject to a terminal disclaimer.

(21) Appl. No.: 11/224,610

(22) Filed: Sep. 12, 2005

(65) Prior Publication Data

US 2007/0058703 A1 Mar. 15, 2007

Related U.S. Application Data

(60) Provisional application No. 60/715,371, filed on Sep. 8, 2005.

(51) Int. Cl.
*H04B 1/38* (2006.01)

(52) U.S. Cl. ............................... 375/219; 455/73; 710/1

(58) Field of Classification Search ................. 375/219; 455/73; 710/1
See application file for complete search history.

(56) References Cited

U.S. PATENT DOCUMENTS

| | | | | |
|---|---|---|---|---|
| 3,394,322 A | * | 7/1968 | Moses | 332/146 |
| 6,094,084 A | * | 7/2000 | Abou-Allam et al. | 327/359 |
| 6,307,894 B2 | * | 10/2001 | Eidson et al. | 375/297 |
| 6,958,665 B2 | * | 10/2005 | Allison et al. | 333/164 |
| 6,992,546 B2 | * | 1/2006 | Chiang et al. | 333/164 |
| 2002/0135513 A1 | * | 9/2002 | Paschen et al. | 342/371 |
| 2003/0067359 A1 | * | 4/2003 | Darabi et al. | 331/46 |
| 2003/0091127 A1 | * | 5/2003 | Jensen et al. | 375/324 |
| 2003/0109233 A1 | * | 6/2003 | Shi et al. | 455/116 |
| 2003/0161413 A1 | * | 8/2003 | Jensen et al. | 375/319 |
| 2003/0169827 A1 | * | 9/2003 | Shi et al. | 375/295 |
| 2003/0171110 A1 | * | 9/2003 | Shi et al. | 455/324 |
| 2003/0202616 A1 | * | 10/2003 | Jensen et al. | 375/316 |
| 2003/0202618 A1 | * | 10/2003 | Jensen et al. | 375/319 |
| 2003/0202619 A1 | * | 10/2003 | Ibrahim et al. | 375/319 |
| 2004/0081256 A1 | * | 4/2004 | Shi et al. | 375/317 |
| 2004/0102170 A1 | * | 5/2004 | Jensen et al. | 455/260 |
| 2004/0161026 A1 | * | 8/2004 | Jensen et al. | 375/224 |
| 2005/0003767 A1 | * | 1/2005 | Song | 455/75 |

* cited by examiner

*Primary Examiner*—Juan A Torres
(74) *Attorney, Agent, or Firm*—Garlick Harrison & Markison; James A. Harrison

(57) ABSTRACT

An integrated circuit radio transceiver includes a phase shift block that is operable to produce a phase shifted current signal at an output of the phase shift block and a mixer with a low input impedance that is operable to produce a phase and frequency shifted output current signal based upon the phase shifted current signal. One aspect of the present invention is that the phase shift block produces an output as a current signal and the mixer block is operably disposed and formed to receive the current signal produced by the phase shift block. Similarly, an operational amplifier configured in a low input impedance mode is provided to receive and amplify a current signal mixer output, all to maximize signal processing head room reduce circuit noise and improve linearity.

20 Claims, 12 Drawing Sheets

FIG. 1 (prior art amplifier stage)

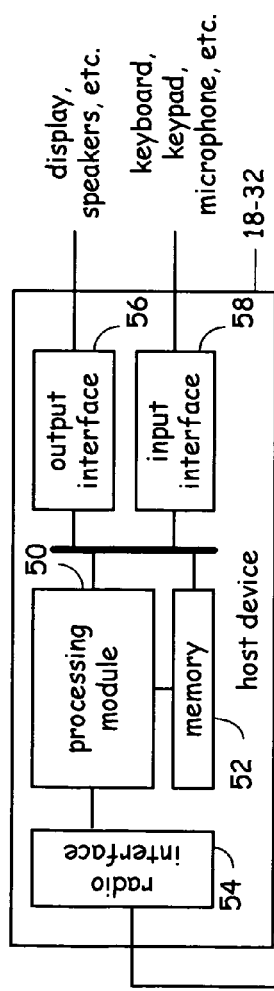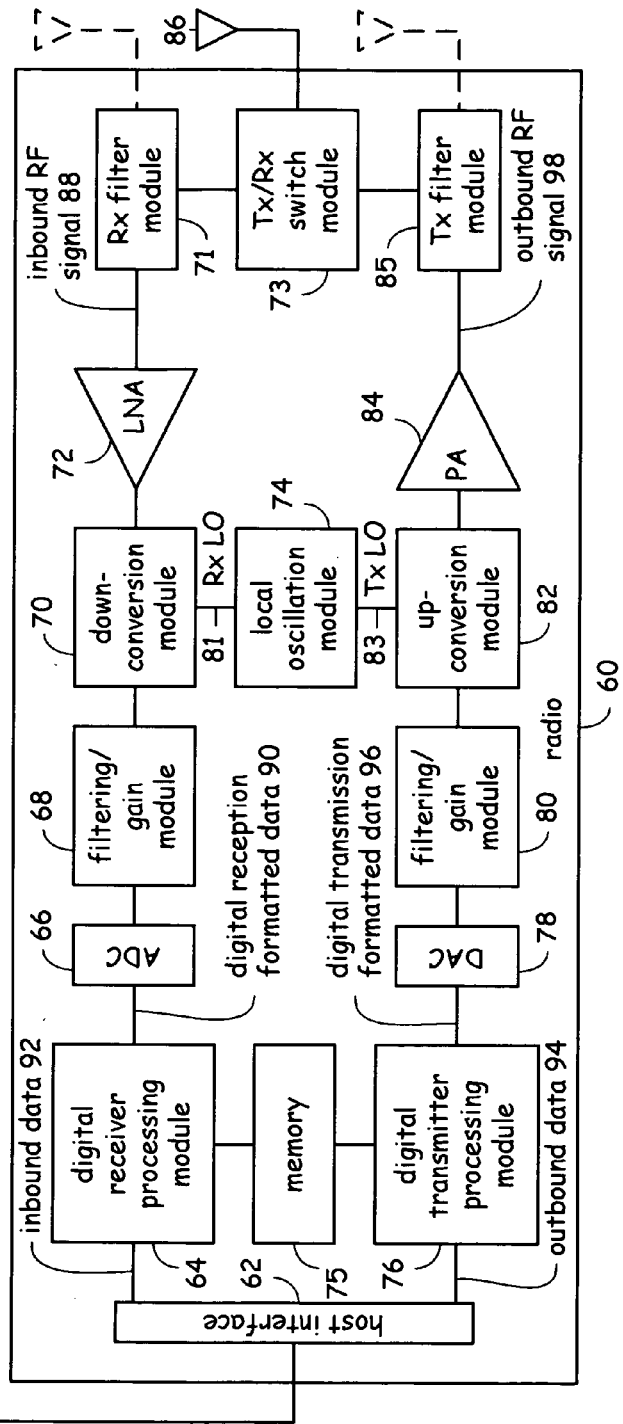
FIG. 3

_US 7,545,856 B2_

CURRENT MODE PHASE SHIFTER, MIXER AND AMPLIFIER

CROSS-REFERENCE TO RELATED APPLICATION

The present U.S. Utility patent application claims priority pursuant to 35 U.S.C. § 119(e) to the following U.S. Provisional Patent Application which is hereby incorporated herein by reference in its entirety and made part of the present U.S. Utility patent application for all purposes:

1. U.S. Provisional Application Ser. No. 60/715,371 entitled "Current Mode Phase Shifter, Mixer and Amplifier," filed Sep. 8, 2005, expired.

BACKGROUND

1. Technical Field

The present invention relates to wireless communications and, more particularly, to a method for phase and frequency shifting an ingoing RF signal.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via a public switched telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier stage. The data modulation stage converts raw data into baseband signals in accordance with the particular wireless communication standard. The one or more intermediate frequency stages mix the baseband signals with one or more local oscillations to produce RF signals. The power amplifier stage amplifies the RF signals prior to transmission via an antenna.

Typically, the data modulation stage is implemented on a baseband processor chip, while the intermediate frequency (IF) stages and power amplifier stage are implemented on a separate radio processor chip. Historically, radio integrated circuits have been designed using bipolar circuitry, allowing for large signal swings and linear transmitter component behavior. Therefore, many legacy baseband processors employ analog interfaces that communicate analog signals to and from the radio processor.

Multiple antenna systems are known to be an efficient solution to increase data rate and/or increase robustness by taking advantage of multi-path scattering present in most indoor and urban environments. Phase shifters (PS) are used to set the phase of the received signal from each antenna. These radio frequency (RF) phase shifters have to meet certain requirements, such as having adjustable phase with the range of 360 degrees, having low loss and control complexity, consuming low power, and/or being compact and low cost to be able to be used in commercial applications. As such, it is desirable to provide a phase shifter (e.g., an RF phase shifter) that has a high shift range, a small size, a low cost, and/or a low power consumption. Further, it is desirable to provide a phase and frequency shift circuit that eliminates circuit parts, decreases noise and, more generally, operates in a more desirable manner.

Additionally, mixer circuits, such as the Gilbert Cell mixer, are often used to frequency shift a signal to up-convert or to down-convert a signal from a first to a second frequency. In a typical Gilbert Cell topology, an input signal is applied to a gate of an input MOSFET for mixing with a local oscillation that is applied to a gate of a second input of the mixer circuit. With such a configuration, a gate-to-source voltage drop is experienced at each device receiving an input voltage signal. In today's integrated circuit transceivers, however, low voltages are used as a supply thereby leaving little head room for voltage drops throughout a circuit path. As such, providing phase shifting, mixing and amplification is desirably done in a manner that minimizes voltage drops to leave a maximum amount of head room for signal processing. Along the same lines, FIG. 1 illustrates a prior art amplifier stage that amplifies voltage signals. Generally, a signal source produces an output signal that is converted to a voltage signal by output resistors RL. A voltage signal input is then produced to a buffer that isolates any resistance and output loading at the output of the signal source. As such, the gain of the amplifier stage of FIG. 1 is given by R2/R1, as is known by one of average skill in the art. The output of the amplifier stage is, therefore, an amplified voltage signal. While the circuit of FIG. 1 is operable to amplify a voltage signal, there are specific applications where it is desirable to minimize noise introduced by a circuit or to increase head room to provide greater amplification and better linearity of alternating current signals within the overall circuit.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which:

FIG. 3 is a schematic block diagram illustrating a wireless communication host device and an associated radio which may include an embodiment of the present invention;

DETAILED DESCRIPTION OF THE DRAWINGS

Figure 1:
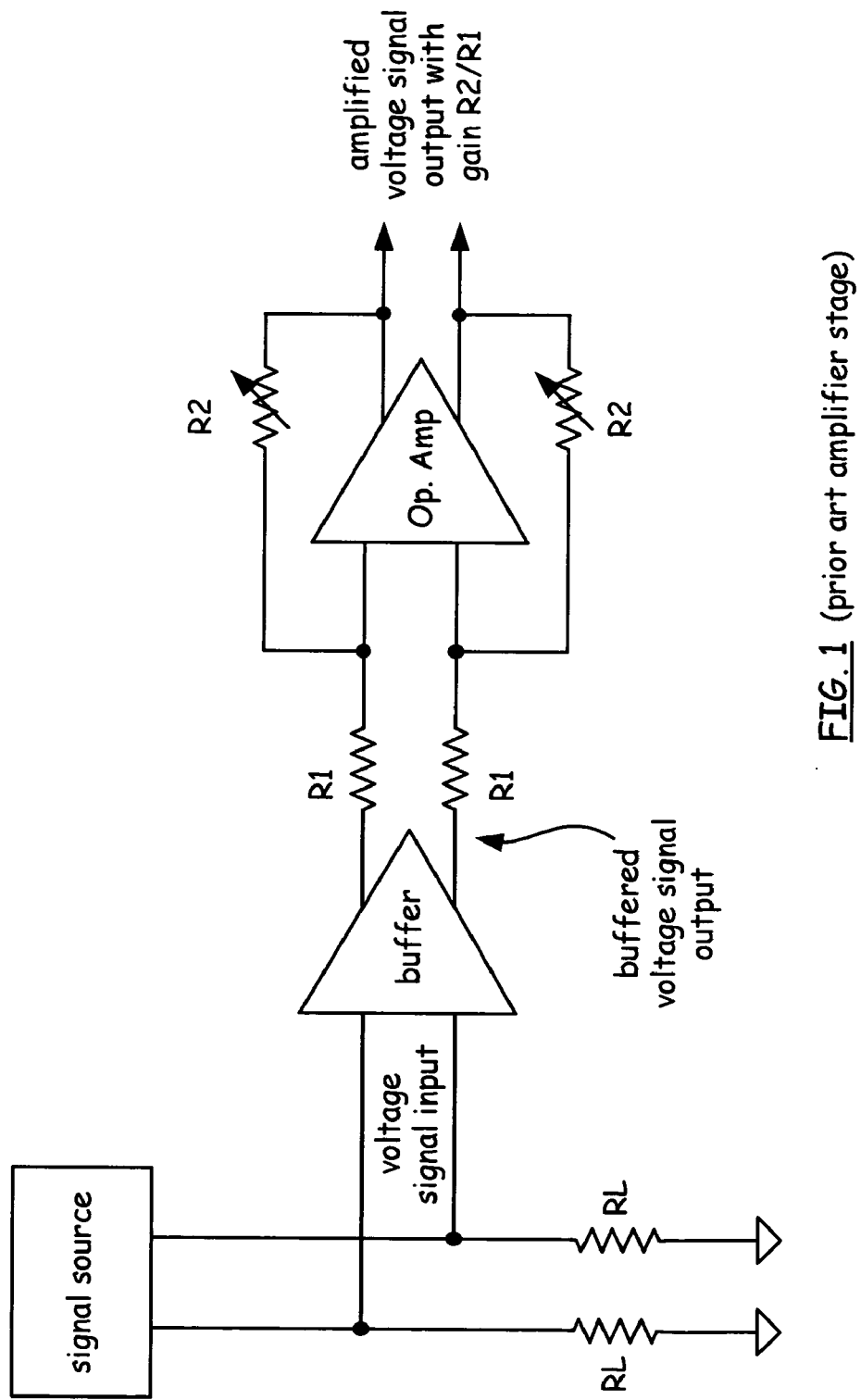
FIG. 1 illustrates a prior art amplifier stage that amplifies voltage signals.
Figure 2:
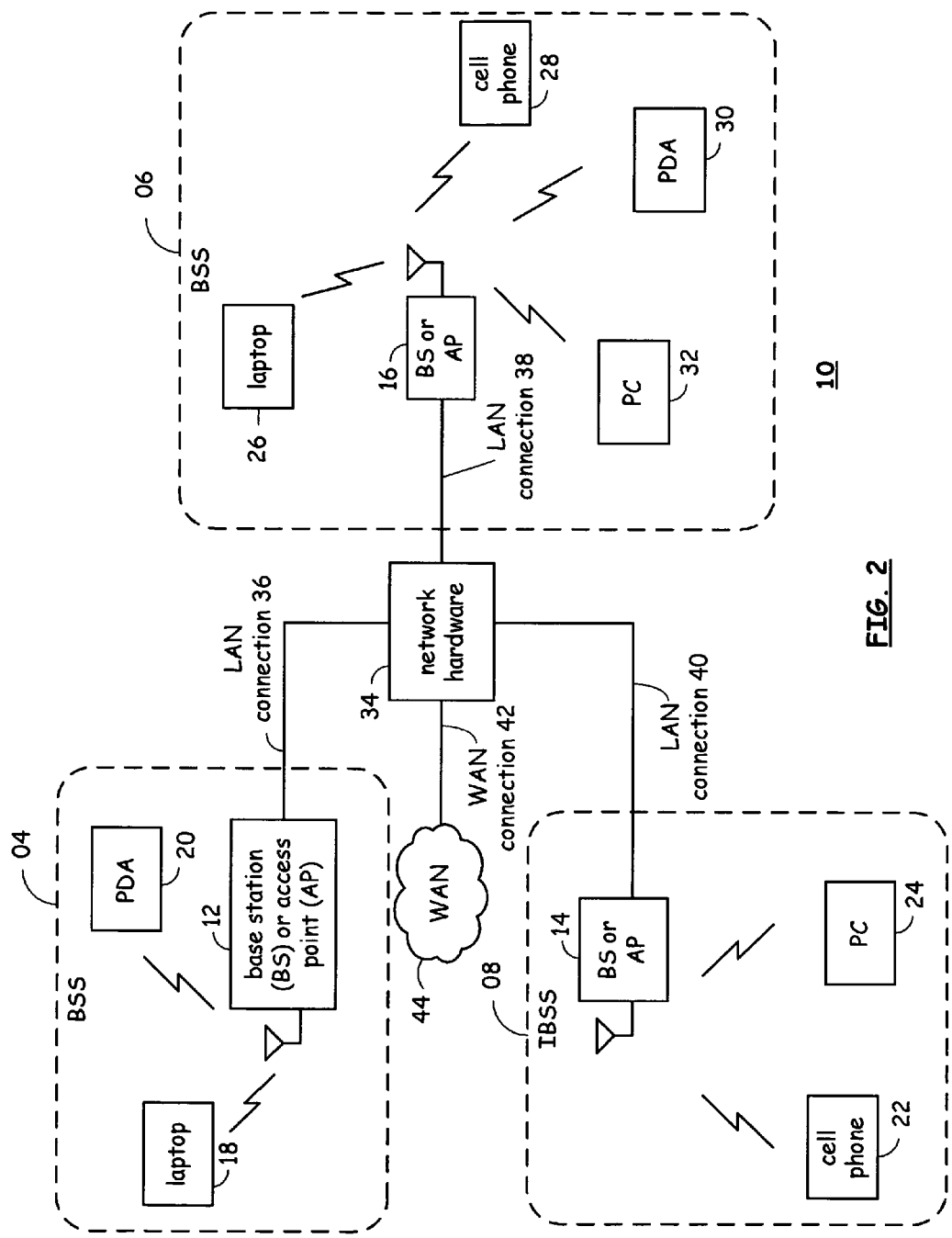
FIG. 2 is a functional block diagram illustrating a communication system that includes circuit devices and network elements and operation thereof according to one embodiment of the invention.

FIG. 2 is a functional block diagram illustrating a communication system that includes circuit devices and network elements and operation thereof according to one embodiment of the invention. More specifically, a plurality of network service areas 04, 06 and 08 are a part of a network 10. Network 10 includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to the subsequent Figures herein.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network (WAN) connection 42 for the communication system 10 to an external network element such as WAN 44. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

FIG. 3 is a schematic block diagram illustrating a wireless communication host device 18-32 and an associated radio 60 which may include an embodiment of the present invention. For cellular telephone hosts, radio 60 is a built-in component. For personal digital assistants hosts, laptop hosts, and/or personal computer hosts, the radio 60 may be built-in or an externally coupled component.

As illustrated, wireless communication host device 18-32 includes a processing module 50, a memory 52, a radio interface 54, an input interface 58 and an output interface 56. Processing module 50 and memory 52 execute the corresponding instructions that are typically done by the host device. For example, for a cellular telephone host device, processing module 50 performs the corresponding communication functions in accordance with a particular cellular telephone standard.

Radio interface 54 allows data to be received from and sent to radio 60. For data received from radio 60 (e.g., inbound data), radio interface 54 provides the data to processing module 50 for further processing and/or routing to output interface 56. Output interface 56 provides connectivity to an output device such as a display, monitor, speakers, etc., such that the received data may be displayed. Radio interface 54 also provides data from processing module 50 to radio 60. Processing module 50 may receive the outbound data from an input device such as a keyboard, keypad, microphone, etc., via input interface 58 or generate the data itself. For data received via input interface 58, processing module 50 may perform a corresponding host function on the data and/or route it to radio 60 via radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/Rx) switch module 73, a local oscillation module 74, a memory 75, a digital transmitter processing module 76, a digital-to-analog converter 78, a filtering/gain module 80, an up-conversion module 82, a power amplifier 84, a transmitter filter module 85, and an antenna 86 operatively coupled as shown. The antenna 86 is shared by the transmit and receive paths as regulated by the Tx/Rx switch module 73. The antenna implementation will depend on the particular standard to which the wireless communication device is compliant.

Digital receiver processing module 64 and digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and modulation. Digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when digital receiver processing module 64 and/or digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and digital receiver processing module 64 and/or digital transmitter processing module 76 executes, operational instructions corresponding to at least some of the functions illustrated herein.

In operation, radio 60 receives outbound data 94 from wireless communication host device 18-32 via host interface 62. Host interface 62 routes outbound data 94 to digital transmitter processing module 76, which processes outbound data 94 in accordance with a particular wireless communication standard or protocol (e.g., IEEE 802.11(a), IEEE 802.11b, Bluetooth, etc.) to produce digital transmission formatted data 96. Digital transmission formatted data 96 will be a digital baseband signal or a digital low IF signal, where the low IF typically will be in the frequency range of one hundred kilohertz to a few megahertz.

Digital-to-analog converter 78 converts digital transmission formatted data 96 from the digital domain to the analog domain. Filtering/gain module 80 filters and/or adjusts the gain of the analog baseband signal prior to providing it to up-conversion module 82. Up-conversion module 82 directly converts the analog baseband signal, or low IF signal, into an RF signal based on a transmitter local oscillation 83 provided by local oscillation module 74. Power amplifier 84 amplifies the RF signal to produce an outbound RF signal 98, which is filtered by transmitter filter module 85. The antenna 86 transmits outbound RF signal 98 to a targeted device such as a base station, an access point and/or another wireless communication device.

Radio 60 also receives an inbound RF signal 88 via antenna 86, which was transmitted by a base station, an access point, or another wireless communication device. The antenna 86 provides inbound RF signal 88 to receiver filter module 71 via Tx/Rx switch module 73, where Rx filter module 71 bandpass filters inbound RF signal 88. The Rx filter module 71 provides the filtered RF signal to low noise amplifier 72, which amplifies inbound RF signal 88 to produce an amplified inbound RF signal. Low noise amplifier 72 provides the amplified inbound RF signal to down-conversion module 70, which directly converts the amplified inbound RF signal into an inbound low IF signal or baseband signal based on a receiver local oscillation 81 provided by local oscillation module 74. Down-conversion module 70 provides the inbound low IF signal or baseband signal to filtering/gain module 68. Filtering/gain module 68 may be implemented in accordance with the teachings of the present invention to filter the inbound low IF signal or the inbound baseband signal to produce a filtered inbound signal.

Analog-to-digital converter 66 converts the filtered inbound signal from the analog domain to the digital domain to produce digital reception formatted data 90. Digital receiver processing module 64 decodes, descrambles, demaps, and/or demodulates digital reception formatted data 90 to recapture inbound data 92 in accordance with the particular wireless communication standard being implemented by radio 60. Host interface 62 provides the recaptured inbound data 92 to the wireless communication host device 18-32 via radio interface 54.

As one of average skill in the art will appreciate, the wireless communication device of FIG. 3 may be implemented using one or more integrated circuits. For example, the host device may be implemented on a first integrated circuit, while digital receiver processing module 64, digital transmitter processing module 76 and memory 75 may be implemented on a second integrated circuit, and the remaining components of radio 60, less antenna 86, may be implemented on a third integrated circuit. As an alternate example, radio 60 may be implemented on a single integrated circuit. As yet another example, processing module 50 of the host device and digital receiver processing module 64 and digital transmitter processing module 76 may be a common processing device implemented on a single integrated circuit.

Memory 52 and memory 75 may be implemented on a single integrated circuit and/or on the same integrated circuit as the common processing modules of processing module 50, digital receiver processing module 64, and digital transmitter processing module 76. As will be described, it is important that accurate oscillation signals are provided to mixers and conversion modules. A source of oscillation error is noise coupled into oscillation circuitry through integrated circuitry biasing circuitry. Local oscillation module 74 includes circuitry for adjusting an output frequency of a local oscillation signal provided therefrom. Local oscillation module 74 receives a frequency correction input that it uses to adjust an output local oscillation signal to produce a frequency corrected local oscillation signal output. While local oscillation module 74, up-conversion module 82 and down-conversion module 70 are implemented to perform direct conversion between baseband and RF, it is understood that the principles herein may also be applied readily to systems that implement an intermediate frequency conversion step at a low intermediate frequency.

Figure 4:
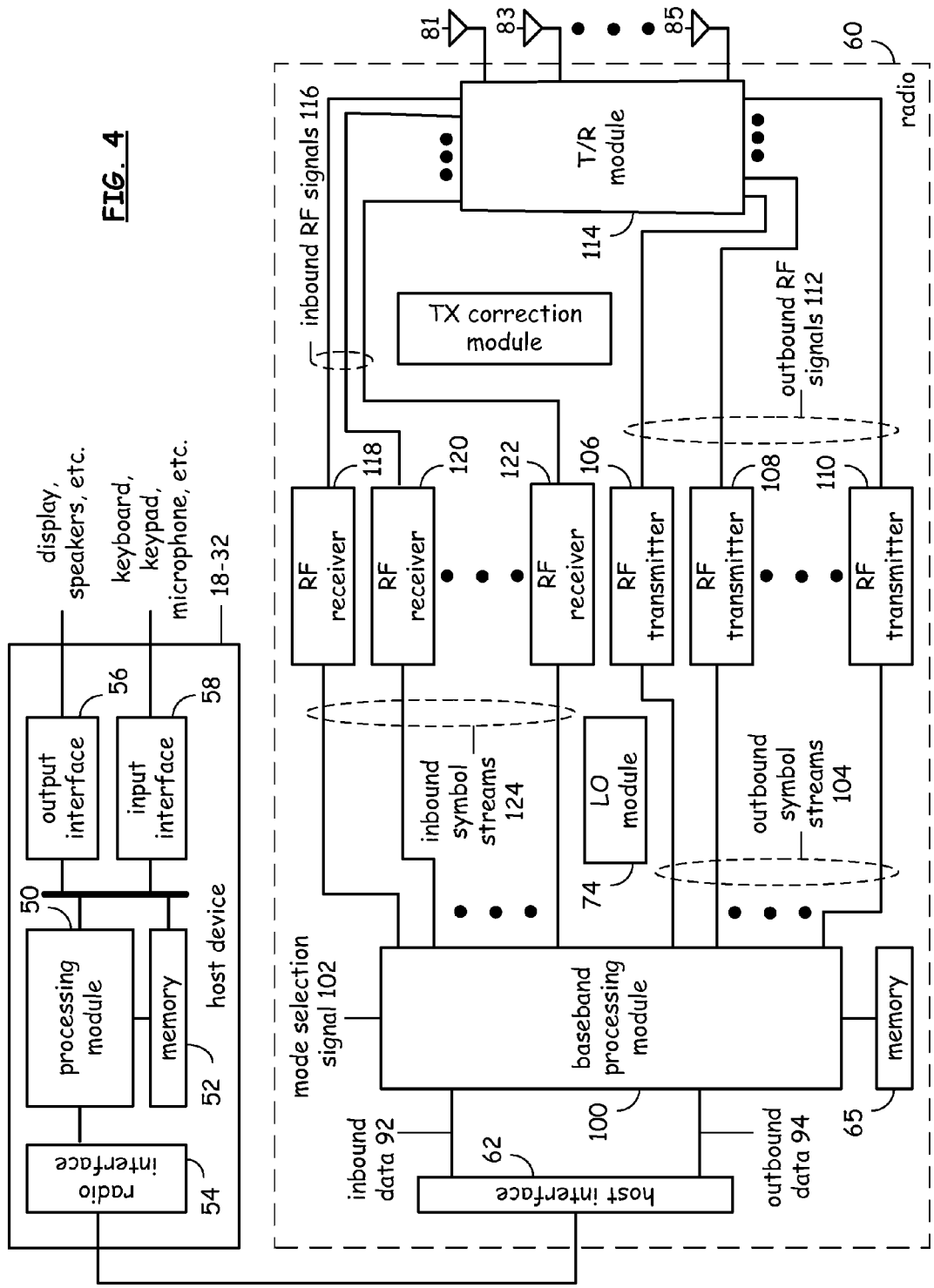
FIG. 4 is a schematic block diagram illustrating a wireless communication device that includes a host device and an associated radio.

FIG. 4 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, etc., such that the received data may be displayed. The radio interface 54 also provides data from the processing module 50 to the radio 60. The processing module 50 may receive the outbound data from an input device such as a keyboard, keypad, microphone, etc., via the input interface 58 or generate the data itself For data received via the input interface 58, the processing module 50 may perform a corresponding host function on the data and/or route it to the radio 60 via the radio interface 54.

Radio 60 includes a host interface 62, a baseband processing module 100, memory 65, a plurality of radio frequency (RF) transmitters 106-110, a transmit/receive (T/R) module 114, a plurality of antennas 81-85, a plurality of RF receivers 118-122, and a local oscillation module 74. The baseband processing module 100, in combination with operational instructions stored in memory 65, executes digital receiver functions and digital transmitter functions, respectively. The digital receiver functions include, but are not limited to, digital intermediate frequency to baseband conversion, demodulation, constellation demapping, decoding, de-interleaving, fast Fourier transform, cyclic prefix removal, space and time decoding, and/or descrambling. The digital transmitter functions include, but are not limited to, scrambling, encoding, interleaving, constellation mapping, modulation, inverse fast Fourier transform, cyclic prefix addition, space and time encoding, and digital baseband to IF conversion. The baseband processing module 100 may be implemented using one or more processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

The memory 65 may be a single memory device or a plurality of memory devices. Such a memory device may be a read-only memory, random access memory, volatile memory, non-volatile memory, static memory, dynamic memory, flash memory, and/or any device that stores digital information. Note that when the baseband processing module 100 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The baseband processing module 100 receives the outbound data 94 and, based on a mode selection signal 102, produces one or more outbound symbol streams 104. The mode selection signal 102 will indicate a particular mode of operation that is compliant with one or more specific modes of the various IEEE 802.11 standards. For example, the mode selection signal 102 may indicate a frequency band of 2.4 GHz, a channel bandwidth of 20 or 22 MHz and a maximum bit rate of 54 megabits-per-second. In this general category, the mode selection signal 102 will further indicate a particular rate ranging from 1 megabit-per-second to 54 megabits-per-second. In addition, the mode selection signal 102 will indicate a particular type of modulation, which includes, but is not limited to, Barker Code Modulation, BPSK, QPSK, CCK, 16 QAM and/or 64 QAM. The mode selection signal 102 may also include a code rate, a number of coded bits per subcarrier (NBPSC), coded bits per OFDM symbol (NCBPS), and/or data bits per OFDM symbol (NDBPS). The mode selection signal 102 may also indicate a particular channelization for the corresponding mode that provides a channel number and corresponding center frequency. The mode selection signal 102 may further indicate a power spectral density mask value and a number of antennas to be initially used for a MIMO communication.

The baseband processing module 100, based on the mode selection signal 102, produces one or more outbound symbol streams 104 from the outbound data 94. For example, if the mode selection signal 102 indicates that a single transmit antenna is being utilized for the particular mode that has been selected, the baseband processing module 100 will produce a single outbound symbol stream 104. Alternatively, if the mode selection signal 102 indicates 2, 3 or 4 antennas, the baseband processing module 100 will produce 2, 3 or 4 outbound symbol streams 104 from the outbound data 94.

Depending on the number of outbound symbol streams 104 produced by the baseband processing module 100, a corresponding number of the RF transmitters 106-110 will be enabled to convert the outbound symbol streams 104 into outbound RF signals 112. In general, each of the RF transmitters 106-110 includes a digital filter and upsampling module, a digital-to-analog conversion module, an analog filter module, a frequency up conversion module, a power amplifier, and a radio frequency bandpass filter. The RF transmitters 106-110 provide the outbound RF signals 112 to the transmit/receive module 114, which provides each outbound RF signal to a corresponding antenna 81-85.

When the radio 60 is in the receive mode, the transmit/receive module 114 receives one or more inbound RF signals 116 via the antennas 81-85 and provides them to one or more RF receivers 118-122. The RF receiver 118-122 converts the inbound RF signals 116 into a corresponding number of inbound symbol streams 124. The number of inbound symbol streams 124 will correspond to the particular mode in which the data was received. The baseband processing module 100 converts the inbound symbol streams 124 into inbound data 92, which is provided to the host device 18-32 via the host interface 62.

As one of average skill in the art will appreciate, the wireless communication device of FIG. 4 may be implemented using one or more integrated circuits. For example, the host device may be implemented on a first integrated circuit, the baseband processing module 100 and memory 65 may be implemented on a second integrated circuit, and the remaining components of the radio 60, less the antennas 81-85, may be implemented on a third integrated circuit. As an alternate example, the radio 60 may be implemented on a single integrated circuit. As yet another example, the processing module 50 of the host device and the baseband processing module 100 may be a common processing device implemented on a single integrated circuit. Further, the memory 52 and memory 65 may be implemented on a single integrated circuit and/or on the same integrated circuit as the common processing modules of processing module 50 and the baseband processing module 100.

Figure 5:
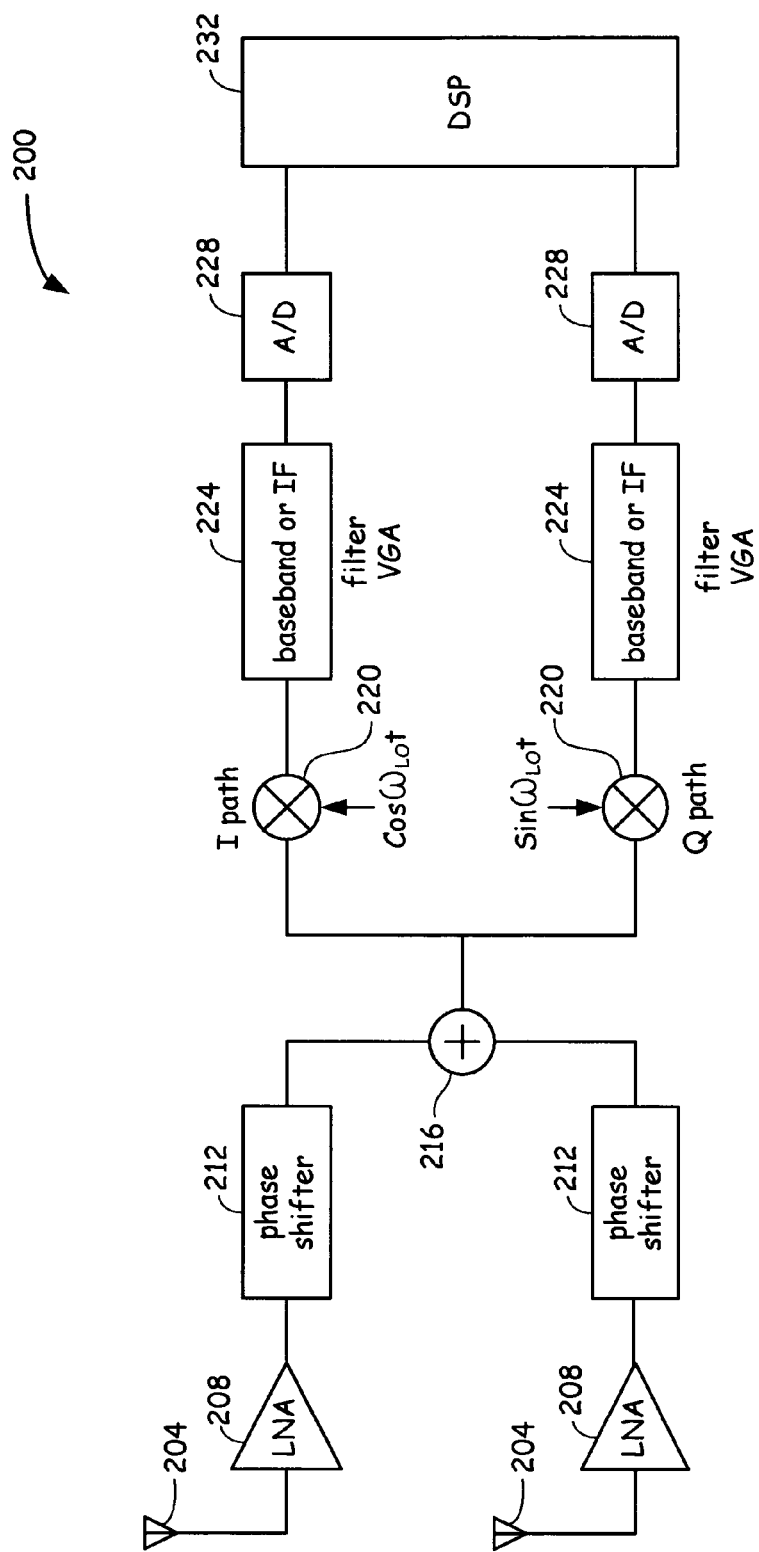
FIG. 5 is a functional schematic block diagram of a radio receiver according to one embodiment of the present invention.

FIG. 5 is a functional schematic block diagram of a radio receiver according to one embodiment of the present invention. Referring to FIG. 5, a receiver 200 includes antennas 204 that are operable to receive multi-path components of an ingoing RF signal and are operably connected to produce the ingoing RF signals to a pair of low noise amplifiers (LNAs) 208. LNAs 208 produce amplified multi-path components to a pair of phase shifters 212 that are operable to phase shift the multi-path components to produce phase-aligned signal current components to a combiner 216. Combiner 216 then produces a combined ingoing RF signal to a pair of mixing blocks 220 that are operable to generate in-phase (I) and quadrature phase (Q) path components at a frequency shifted frequency. The frequency shifted frequency may be either to a baseband frequency or intermediate frequency signal as those terms are understood by one of average skill in the art. The frequency shifted I and Q path components are then produced to a pair of variable gain amplifiers (VGAs) 224 that provide variable gain high-pass filtering. It is understood that VGAs 224 may include a plurality of filters and/or amplifiers. The VGAs 224 then produce high-pass filtered and amplified ingoing frequency shifted continuous waveform signals to a pair of analog-to-digital converters 228 that produce ingoing digital signals to a digital signal processor (or a communications controller) 232 for subsequent processing.

In one embodiment, the digital signal processor 232 is operating in accordance with one or more standards, including but not limited to, IEEE 802.11, Bluetooth, advanced mobile phone services (AMPS), global systems for mobile communications (GSM), code division multiple access (CDMA), local multi-point distribution systems (LMDS), multi-channel-multi-point distribution systems (MMDS), and/or variations thereof. In an exemplary embodiment, the digital signal processor 232 is coupled to the phase shifters 212 and is an integrated digital controller with multiple inputs and outputs, such as a transmit data output and a receive data input. In the illustrated receiver 200, each of the phase shifters 212 is coupled to a corresponding one of the antennas 204 by way of an LNA 208. In one embodiment, each of the phase shifters 212 provides a 0 to 360 degrees of phase shift.

One of the mixing blocks 220 is an in-phase (I) path mixer (for mixing a cosine waveform with the input signal to produce a frequency shifted output) and another one of the frequency mixers is a quadrature (Q) path mixer (or for mixing a sine waveform with the input signal). As is known by one of average skill in the art, the step of mixing two signals typically comprises a Gilbert Cell to multiply to sinusoidal waveforms to create a frequency shifted output signal.

Each of the intermediate processing stages comprising VGAs 224 can be a filter and/or a variable gain amplifier (VGA). In an exemplary operation of the illustrated receiver 200 of FIG. 5, the phase shifters 212 receive inbound RF signals from the antennas 204 via one of the low noise amplifiers (LNAs) 208, respectively, coupled between the antennas 204 and the phase shifters 212. Each of the phase shifters 212 then respectively phase shifts the RF signals as necessary to phase align the received multi-path components of an ingoing RF signal. The phase shifted RF signals are then combined by the combiner 216 into combined phase shifted RF signals (e.g., having a first 0-360 degrees of phase shift and a second 0-360 degrees of phase shift). The mixing blocks 220 then respectively mix the combined RF signals into a first frequency shifted (mixed) signal (e.g., having a sine waveform) and a second frequency shifted signal (e.g., having a cosine waveform). The intermediate processing stages, or VGAs 224, then preliminarily process the first and second frequency shifted signals, respectively (e.g., by filtering and/or amplifying the signals) to produce the low-pass/band-pass filtered and amplified ingoing continuous waveform signals to the analog-to-digital converters 228 that produce the ingoing digital signals to the digital signal processor 232.

The digital signal processor (or communications controller) 232 then recovers and/or further processes the data in the ingoing digital signals in accordance with the particular communications standard in use. In view of the foregoing, an exemplary embodiment of the present invention provides an RF phase shifter. As will be described in greater detail, the phase shifter, combiner and mixing blocks are formed as one integrated block that operate on current signals without converting a current signal output of the phase shifter into a voltage signal and then back into a current signal in the downstream mixer.

Figure 6:
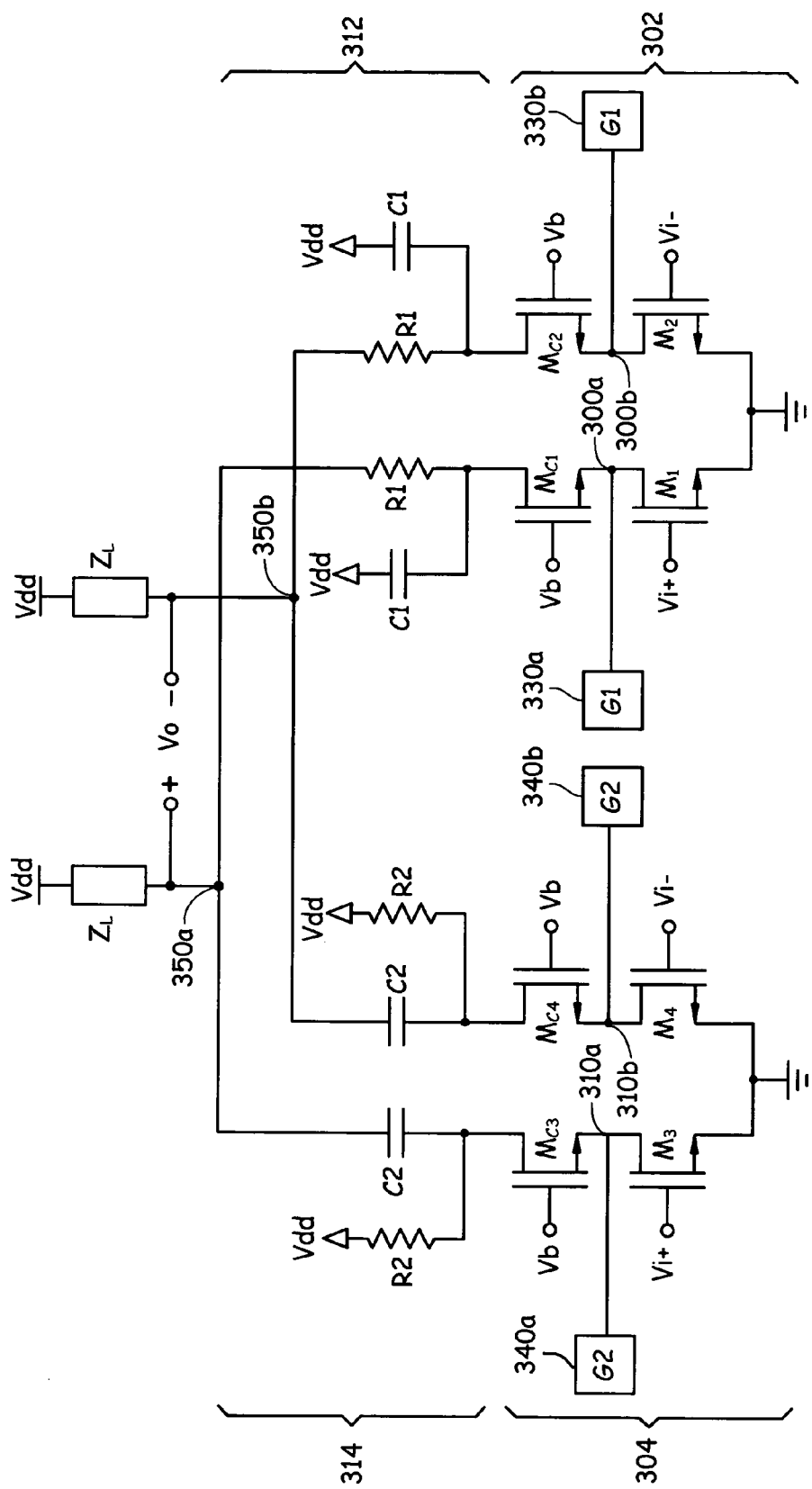
FIG. 6 is a functional schematic diagram of an embodiment of the present invention of a differential phase shifter.

FIG. 6 is a functional schematic diagram of an embodiment of the present invention of a differential phase shifter. First and second differential pairs 302, 304 include differential inputs Vi+, Vi− that are fed from an output of a previous stage (not shown). The first and second differential pairs 302, 304 convert voltage to current. By passing the currents through the RC circuit pairs 312, 314, the 90 degrees phase shifted signals are generated and combined with each other at nodes 350a, 350b to give the final signal. By changing the gain of each of the first and second differential pairs 302, 304, via gain controllers 330a, 330b, 340a, 340b, the desired phase or phase angle θ can be generated at the output of nodes 350a, 350b. To get 360 degrees phase shifting, the embodiment of FIG. 6 is operable to change the polarity of the input of the first and second differential pairs 302, 304.

To explain in more detail, loads $Z_L$ are coupled to the first and second differential pairs 302, 304 via nodes 350a, 350b. The first and second differential pairs 302, 304 include cascoded transistor pairs having n-channel MOSFETs (e.g., $M_{c1}$ and $M_1$) serially coupled together such that the source of a cascode transistor (e.g., MOSFET $M_{c1}$) is coupled to the drain of a transconductance transistor (e.g., MOSFET $M_1$) via a connection-control node (e.g., 300a).

In addition, gain controller 330a, 330b, 340a, 340b is respectively coupled to each connection-control node 300a, 300b, 310a, 310b. In this embodiment, at least one of differential input voltages Vi+, Vi− is coupled to each of the transconductance transistors ($M_1$-$M_4$) of the first and second differential pairs 302, 304. The transconductance transistors ($M_1$-$M_4$) are for changing voltage(s) into current(s). Further, the cascode transistors ($M_{c1}$-$M_{c4}$) of the first and second differential pairs 302, 304 are, by way of example, coupled to control voltages Vb. The cascode transistors ($M_{c1}$-$M_{c4}$) are included for impedance balancing, gain control, increasing output impedance, reducing an effective capacitance input, and/or improving linearity.

In operation, the first differential pair 302 converts a differential input voltage into a first differential current as a function of an input voltage Vi+, Vi−. In addition, the gain controllers 330a, 330b via the connection-control nodes 300a, 300b control a gain of the first differential current. In a similar manner, the second differential pair 304 controls the output current and gain of the second differential pair 304. For example, the gain controllers 340a, 340b via the connection-control nodes 310a, 310b control a gain of a second differential current after the second differential pair 304 current converts a differential input voltage into the second differential current in accordance with the input voltage Vi+, Vi−.

As such, by passing the currents outputted from the first and second differential pairs 302, 304 through the RC-CR circuit pairs 312, 314, the 90 degrees phase shifted signals are generated and added in nodes 350a, 350b (and/or the loads $Z_L$) to give the final signal. In addition, by changing the gain of the each of the first and second differential pairs 302, 304 via the gain controllers 330a, 330b, 340a, 340b, the desired phase or phase angle θ can be generated after adding the two currents. To get 360 degrees phase shifting, the embodiment of FIG. 6 needs only to change the polarity of the currents initially generated by one or both of the first and second differential pairs 302, 304.

Figure 7:
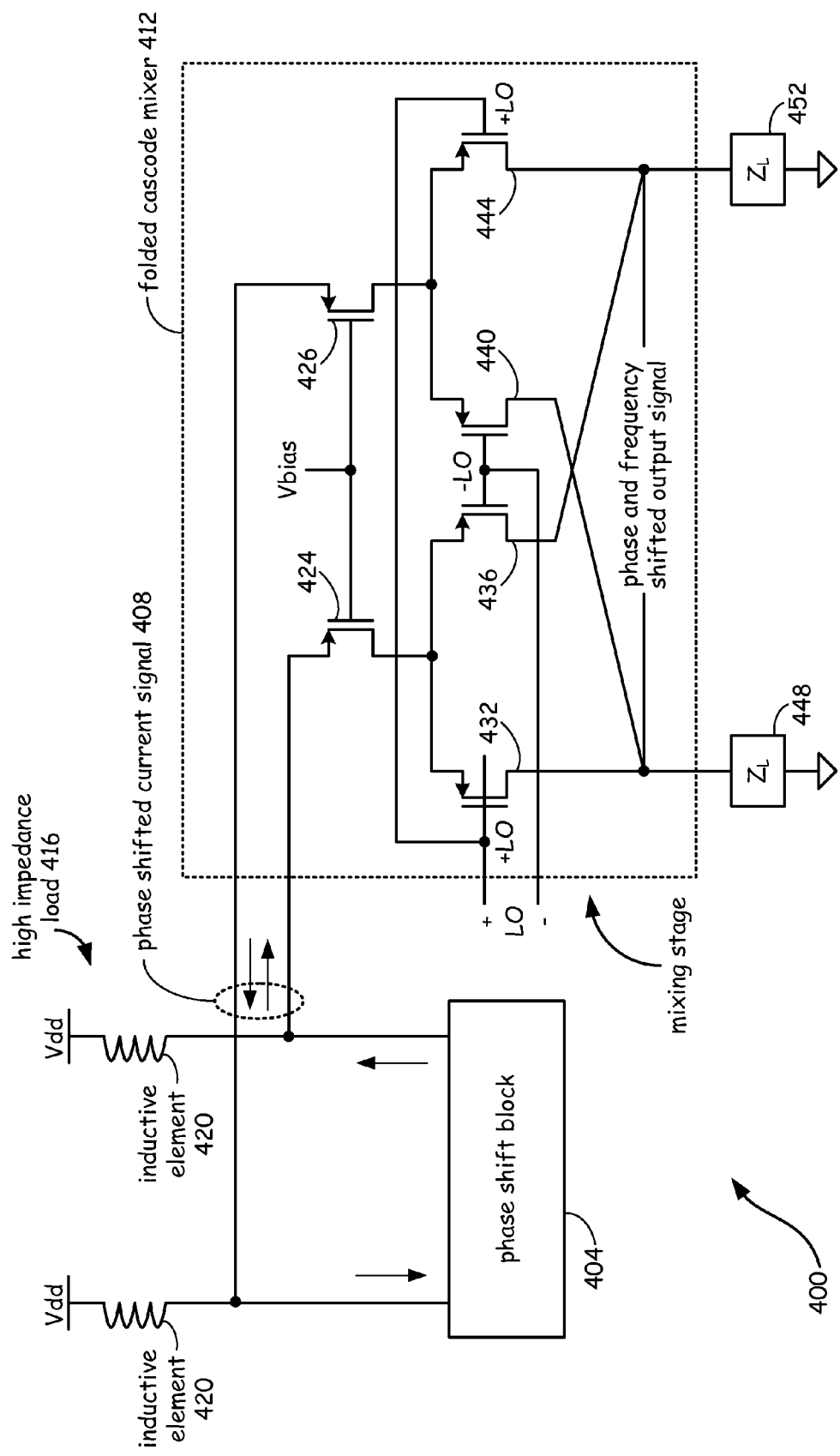
FIG. 7 is a functional schematic diagram of an integrated phase shift mixer formed according to one embodiment of the present invention.

FIG. 7 is a functional schematic diagram of an integrated phase shift mixer formed according to one embodiment of the present invention. Referring to FIG. 7, an integrated phase shift mixer 400 includes a phase shift block 404 that is operably disposed to produce a phase shifted current signal 408 to a folded cascode mixer 412. As may further be seen, the output of phase shift block 404 is operably coupled to a high impedance load shown generally at 416 which is further coupled to a supply Vdd.

Generally, the folded cascode mixer 412 is configured to provide a substantially low input impedance in comparison to the high impedance load 416. Accordingly, the output of phase shift block 404 generates phase shifted current signal 408 that flows into the folded cascode mixer 412 instead of into the high impedance load 416. In the described embodiment of the invention, the high impendence load 416 includes a pair of inductive elements 420. Inductive elements 420 may be replaced by other known load devices including resistors, capacitors, RC tanks, or any combination of the same with or without inductive elements.

Continuing to examine FIG. 7, the output of phase shift block 404 is specifically coupled to the source terminals of a pair of p-channel MOSFETs, namely MOSFETs 424 and 426. MOSFETs 424 and 426 are cascode devices and provide a low impedance cascode input. Specifically, because the cascode MOSFETs 424 and 426 are coupled to the output of phase shift block 404 at the source terminals of the MOSFETs 424, a low impedance input is provided therefor. The drain terminals of cascode MOSFETs 424 and 426 are then coupled to a standard mixer switching block that includes four p-channel MOSFETs 432, 436, 440, 444. Specifically, the drain terminal of MOSFETs 424 is coupled to the source terminals of MOSFETs 432 and 436 while the drain terminal of MOSFET 426 is coupled to the source terminal of MOSFETs 440 and 444. The p-channel MOSFETs 432, 436, 440, 444 are cross coupled substantially as shown and are further coupled to load devices 448, 452. In the described embodiment of the invention, load devices 448 and 452 are resistive devices, though other types of load circuits or devices may be used therefor. More specifically, the drain terminals of MOSFETs 432 and 440 are coupled to each other and to load device 448, while the drain terminals of MOSFETs 436 and 444 are coupled to each other and to load device 452.

In operation, the mixer block of FIG. 7 comprises a plurality of p-channel MOSFETs configured as a folded cascode mixer. As such, known mixing operations occur even though the configuration provides a low impedance input to draw current from the phase shift block 404. Moreover, in traditional mixer blocks, an input signal is applied to the gate terminals of the cascode input devices. Here, however, the input signal is provided in the form of a current to the source terminals of the p-channel MOSFETs 424. Thus, the gate terminals of MOSFETs 424 are merely coupled to receive a bias signal for DC operation.

Figure 8:
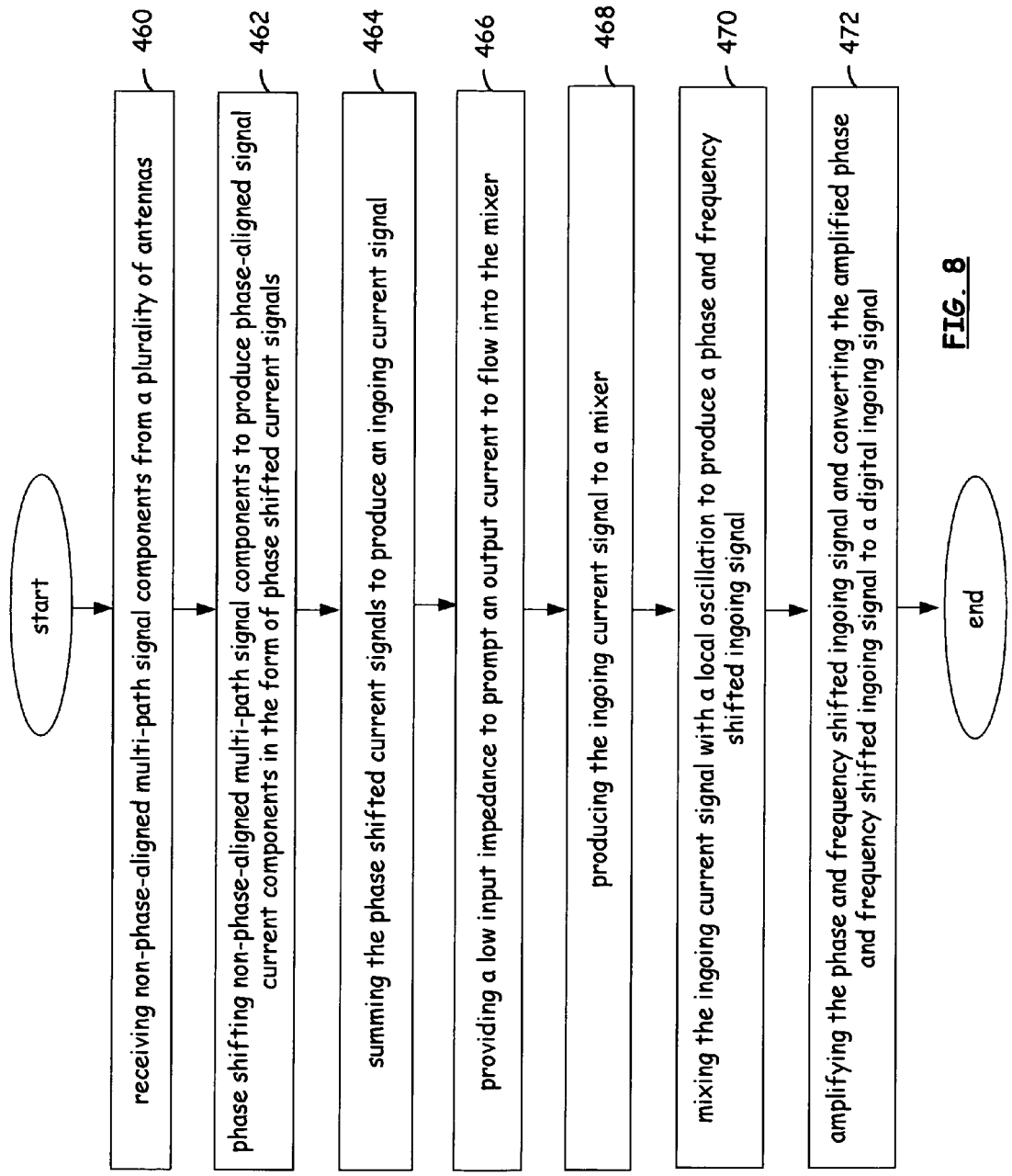
FIG. 8 is a flow chart that illustrates a method for providing phase and frequency shifted ingoing signals to a digital processor according to one embodiment of the present invention.

FIG. 8 is a flow chart that illustrates a method for providing phase and frequency shifted ingoing signals to a digital processor according to one embodiment of the present invention. Initially, the method includes receiving non-phase-aligned multi-path signal components from a plurality of antennas (STEP 460). As is known by one of average skill in the art, a transmitted radio frequency signal, because of multi-path interference, among other reasons, will arrive at a specified location as a series of multi-path signal components due to the signal being obstructed and reflected by various structures. Thus, reception may be improved by utilizing a plurality of antennas to receive the multi-path signal components. Thus, the described method includes receiving these multi-path signal components which are separated in timing or phase. Thus, a subsequent step includes phase shifting the non-phase-aligned multi-path signal components to produce phase-aligned signal current components in the form of phase shifted current signals (STEP 462). The method then includes summing the phase shifted current signals to produce an ingoing current signal (STEP 464).

As described before, a phase shift circuit is operably coupled to a high impedance load device. Accordingly, to prompt the output current to flow into a mixer as a current signal, the invention includes providing a low input impedance to prompt the output current to flow into the mixer (STEP 466). In an embodiment that includes cascoded devices at an input stage of the mixer, the invention includes producing the ingoing current signal to a mixing circuit or block, or more generally, to a mixer (STEP 468). Subsequently, the invention includes mixing the ingoing current signal with a local oscillation to produce a phase and frequency shifted ingoing signal (STEP 470). In each of the above steps starting with STEP 462, all processing has occurred on current signals. Unlike traditional circuits, the phase shift output is not converted to a voltage signal prior to being produced to a mixer. Rather, for a plurality of advantageous reasons, all signals are kept as current signals and the above method is utilized to prompt the current signals to flow into the mixer for frequency shifting or mixing. Thus, the final step of the described method includes amplifying the phase and frequency shifted ingoing signal and converting the amplified phase and frequency shifted ingoing signal to a digital ingoing signal for processing by a digital processor (STEP 472).

Figure 9:
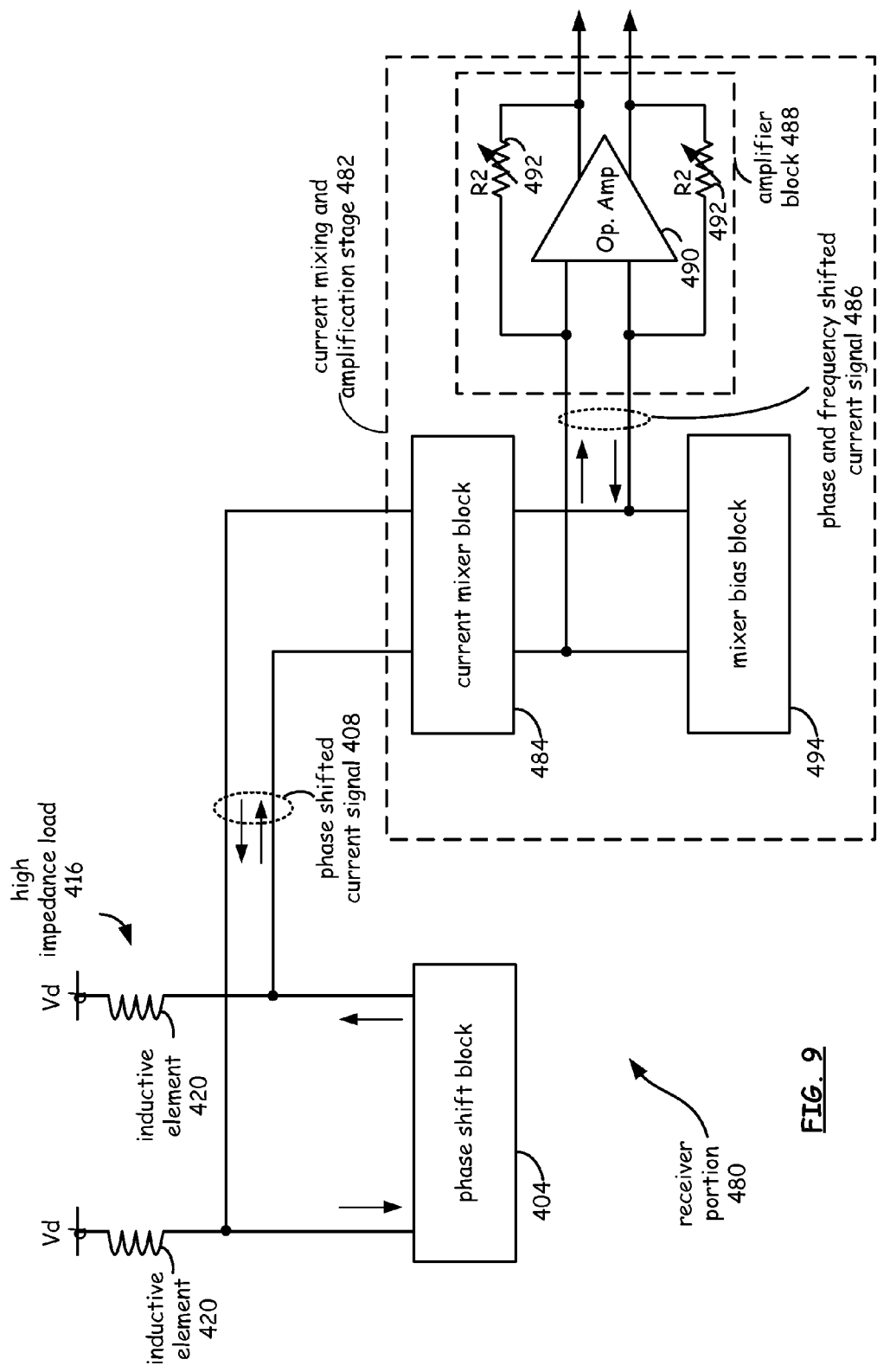
FIG. 9 is a functional schematic block diagram of a portion of a radio receiver according to one embodiment of the present invention.

FIG. 9 is a functional schematic block diagram of a portion of a radio receiver according to one embodiment of the present invention. Commonly numbered parts with other figures suggest that the parts are similar. The phase shifted current signal 408 that is produced as an output of phase shift block 404 is received by a current mixing and amplification stage 482 of receiver portion 480. Specifically, the phase shifted current signal 408 is received by a current mixer block 484 that produces a phase and frequency shifted current signal 486 to an amplifier block 488. In the described embodiment of the invention, the phase and frequency shifted current signal 486 produced by current mixer block 484 is a current signal that is prompted to flow into amplifier block 488. To prompt the phase and frequency shifted current signal 486 to flow into amplifier block 488, a virtual ground is created at the input of amplifier block 488 and, more specifically, at the input of operational amplifier 490 in the described embodiment of the invention. As may be seen, a pair of feedback resistors 492 is differentially disposed between an output of operational amplifier 490 and the inputs of operational amplifier 490. A mixer bias block 494 includes a relatively high input impedance which is operable to serve as a relatively high output load impedance for current mixer block 484 in relation to the input impedance of amplifier block 488 and, more specifically, operational amplifier 490.

In operation, receiver portion 480 of FIG. 9 includes phase shift block 404 that receives an alternating signal that is phase shifted as described above. The phase shift block 404 produces phase shifted current signal 408 that flows to current mixer block 484 of current mixing and amplification stage 482 because of the relatively high output load impedance of high impedance load 416 which comprises a pair of inductive elements 420. Similarly, phase and frequency shifted current signal 486 is produced by current mixer block 484 which is prompted to flow into amplifier block 488 because of a virtual ground input impedance of the amplifier block 488 in relation to a load impedance provided by mixer bias block 494. Operational amplifier 490 of amplifier block 488 then amplifies the phase and frequency shifted current signal 486 to produce a differential amplified output.

Figure 10:
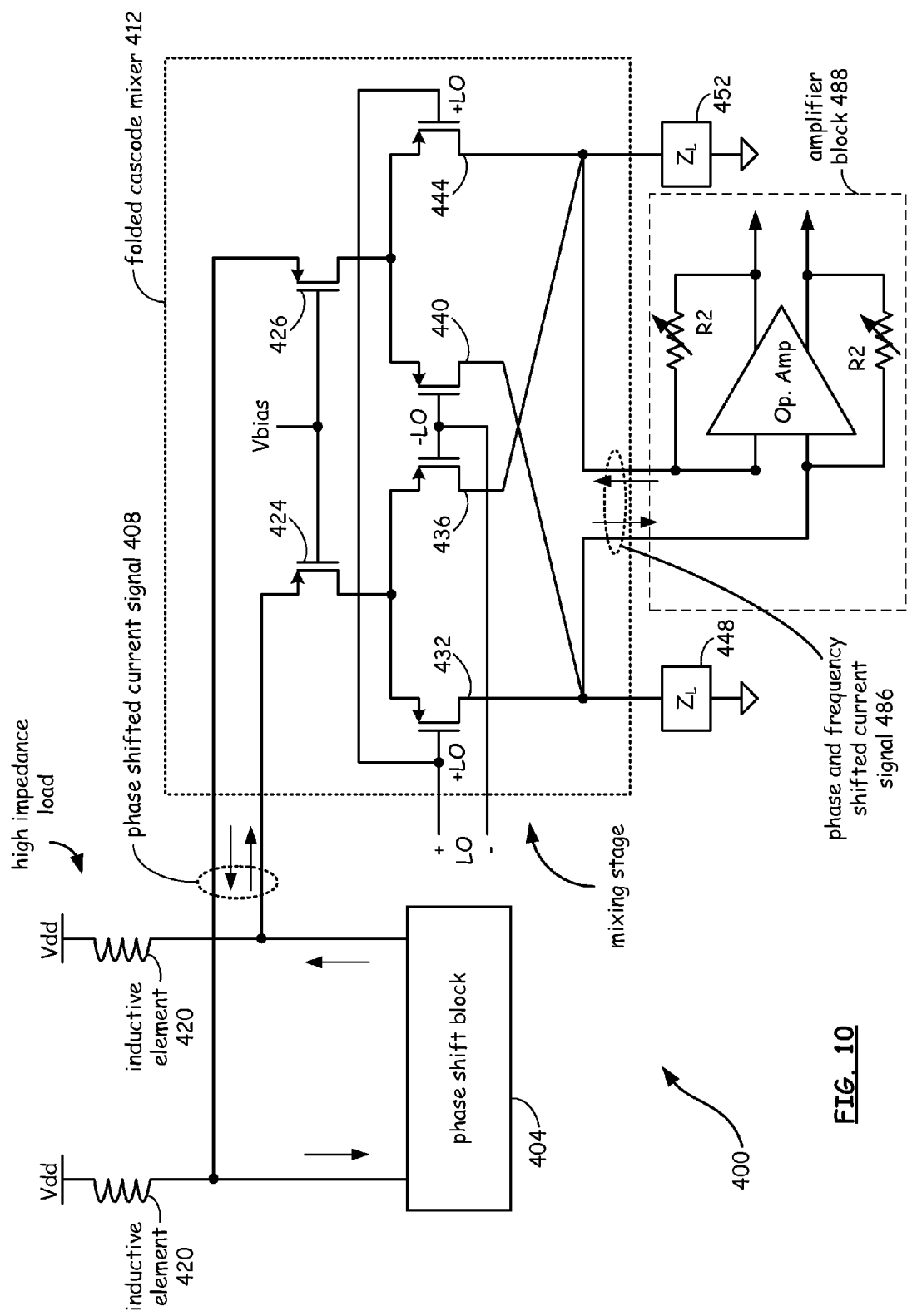
FIG. 10 is a functional schematic diagram of a receiver portion of an integrated circuit radio transceiver according to one embodiment of the invention.

FIG. 10 is a functional schematic diagram of a receiver portion of an integrated circuit radio transceiver according to one embodiment of the invention. As may be seen, many of the components of FIG. 10 are similarly numbered as in FIG. 7. Operation of these commonly number parts is similar. Further, FIG. 10 includes an amplifier block 488 operably disposed to receive a phase and frequency shifted current signal output of the mixing block which is shown here as folded cascode mixer 412. While amplifier block 488 is operably disposed within the transceiver for the primary purpose of providing amplification of the phase and frequency shifted signal, each of the prior stages are also amplification stages, though their primary purpose is not necessarily to provide amplification. For example, the folded cascode mixer 412 has a primary purpose of frequency shifting a received signal, the mixer comprises MOSFET transistors that also provide some amplification of a signal. Similarly, the phase shifter includes amplification circuits as well. As such, the mixer and phase shifter are also referred to herein as amplification stages or blocks. Finally, a radio receiver typically includes a low noise amplifier which provides an amplification of a received radio frequency signal and, as such, also is an amplification stage.

Referring back to FIG. 10, amplifier block 488 includes, in the described embodiment, an amplifier circuit (here, an operational amplifier) with a feedback resistor R2 wherein gain of this amplification stage is primarily a function of a value of the feedback resistor R2 multiplied with the $g_m$ (amplification) of a prior stage which, here, is the mixer block comprising folded cascode mixer 412 and shown more generally as a mixing stage.

While the above described embodiment of the invention includes a folded cascode mixer 412, an alternate embodiment includes a mixer that does not have the low impedance cascode input provided by MOSFETs 424 and 426. Because of the described mixing block configuration, one embodiment contemplates the folded cascode mixer 412 being coupled directly to receive the phase shifted current signal 408. Accordingly, phase shifted current signal 408 is provided directly to the source terminals of MOSFETs 432-444.

Generally, one aspect of the present invention includes forming a mixer with a low impedance input in combination with a high impedance load in a prior stage to prompt current from the output of the prior stage to flow into the mixer instead of the load device or devices. The described embodiment, however, is specifically for a phase and frequency shift mixer that includes a phase shift block that produces a phase shifted current signal to a folded cascode mixer that receives the phase shifted current signal and produces a phase and frequency shifted current output signal that is then produced to a low impedance amplifier block 488.

The output of the integrated phase shift mixer of FIG. 7 or of FIG. 10 may be one of an intermediate band or baseband frequency signal for subsequent processing prior to conversion to a digital format for final processing by a digital processor. Generally, the described embodiment of the invention includes the low impedance cascode inputs provided by MOSFETs 424 and 426 because the MOSFETs, as configured in FIG. 7, provide lower impedance, better linearity, and less noise.

Figure 11:
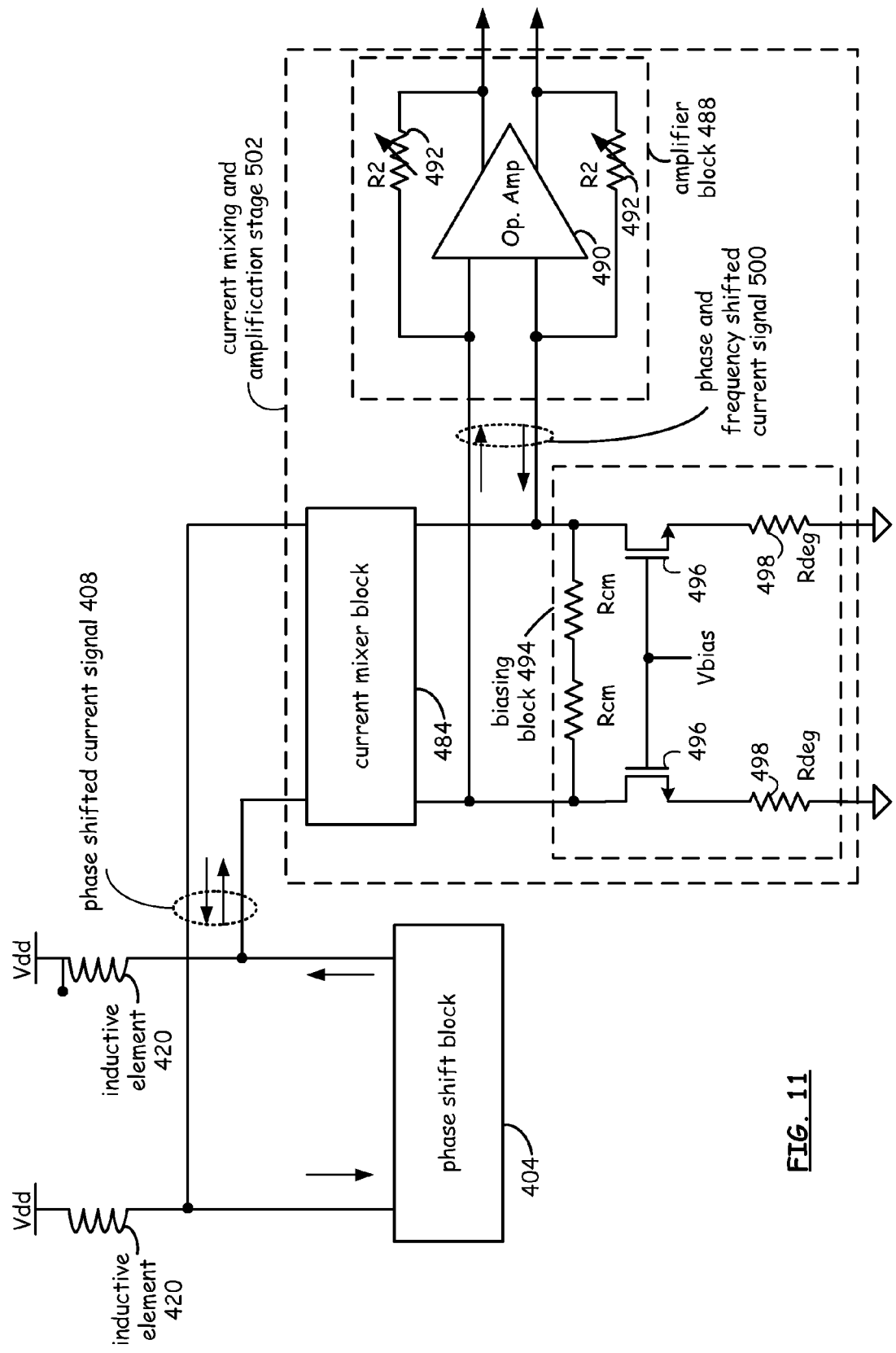
FIG. 11 is a functional schematic block diagram of an embodiment of a portion of a receiver front end.

FIG. 11 is a functional schematic block diagram of an embodiment of a portion of a receiver front end. As before, commonly numbered references to parts described in relation to the other figures are similar. In the embodiment of FIG. 11, a phase shift block 404 is operably disposed to provide a phase shifted current signal 408 to a current mixer block 484. Here, however, current mixer block 484 is a part of current mixing and amplification stage 502. A biasing block 494 operably disposed to provide biasing and an output load for current mixer block 484 includes at least one large value resistor $R_{cm}$ for sensing a common mode signal operably disposed across drain terminals of a pair of n-channel MOSFETs 496 whose source terminals are each connected to degeneration resistors 498. Resistors 498 are also coupled to circuit common. The output of current mixer block 484 and of biasing block 494, which are commonly coupled, is also connected to the inputs of amplifier block 488 to provide a phase and frequency shifted signal 500 thereto. Amplifier block 488 is as described before. Phase and frequency shifted signal 500 may be the same or different than phase and frequency shifted current signal 486 of FIG. 9 based on similarities or differences in implementation within mixer bias block 494.

As described before, amplifier block 488 includes, for alternating current purposes, a virtual ground at the amplifier stage input which is operable to prompt current to flow into the amplifier and allows the system to stay in a current mode of operation. In other words, a current output of current mixer block 484 need not be converted to a voltage signal prior to being produced to amplifier block 488. In the described embodiment, therefore, a buffer between amplifier block 488 and the output of the current mixer block 484 is eliminated. Also, in the current design, the resistor R1 is eliminated. Thus, noise that is introduced by R1 and the buffer are eliminated. Further, eliminating the buffer results in a virtual ground at the amplifier input which prompts current to flow towards the amplifier inputs. Removing the buffer also increases the head room which allows MOSFETs within the biasing block to be sized up, meaning their channel length may be increased. As is known by one of average skill in the art, increasing channel length decreases the amount of noise produced by the MOSFETs while the DC current and width are kept constant. Thus, specifically, the channel lengths of MOSFETs 496 may be increased to further reduce noise. An additional benefit of the circuit of FIG. 11 is that the virtual ground provided by amplifier block 488 keeps the alternating current signal swing from being so large that clipping occurs. Accordingly, gain of the amplifier block 488 is now based upon a product of the $G_m$ of the current mixer block 484 and a resistance value of resistor R2 which is shown herein as resistor 492 Thus, as may be seen, two noise sources, mainly R1, and the buffer are eliminated to reduce overall noise. Further, by increasing head room, as the design accomplishes in FIG. 11, n-channel MOSFETs 496 may include increased channel lengths to further reduce noise. The present embodiment is thus advantageous in that additional head room is created and noise is reduced.

Continuing to examine FIG. 11 and, more specifically, biasing block 494, the degeneration resistors $R_{dgen}$ are operable to reduce noise within the biasing block 494. A bias voltage $V_{bias}$ is coupled to the gate terminals of n-channel MOSFETs 496 to provide a DC bias voltage across the gate-to-source terminals of MOSFETs 496. The resistors 498 coupled between the source terminals of MOSFETs 496 and circuit common are operable to reduce the noise of the n-channel MOSFETs. Because the input impedance for an alternating current signal of amplifier block 488 is a virtual ground, inclusion of the resistors $R_{cm}$ within biasing block 494 does not serve to decrease head room in any substantial manner. The reason, of course, is that the phase and frequency shifted current signal 500 produced from current mixer block 484 will flow into amplifier block 488 and through the feedback resistors 492.

Figure 12:
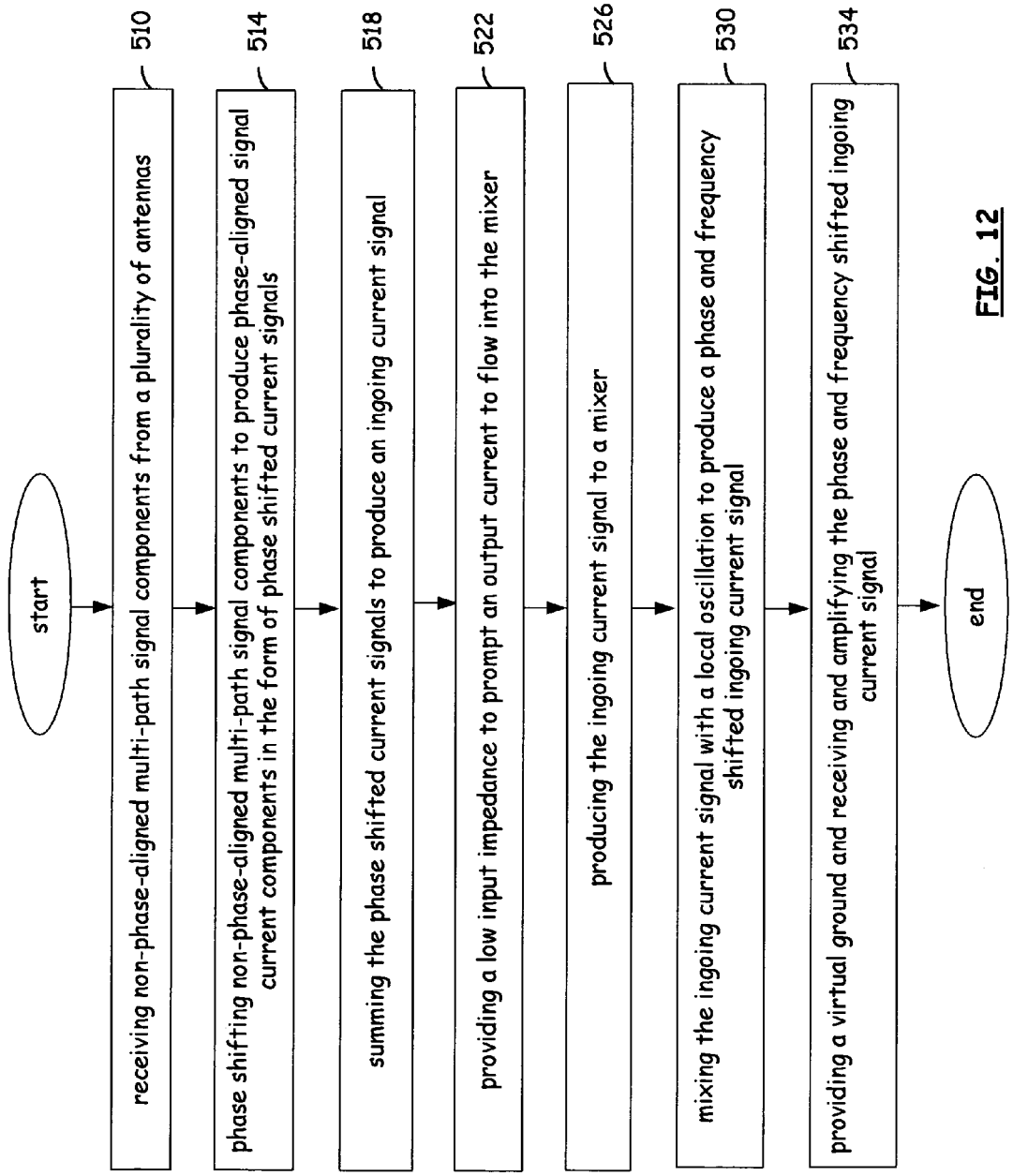
FIG. 12 is a flow chart that illustrates a method for amplifying phase and frequency shifted ingoing signals according to one embodiment of the present invention.

FIG. 12 is a flow chart that illustrates a method for amplifying phase and frequency shifted ingoing signals according to one embodiment of the present invention. Initially, the method includes receiving non-phase-aligned multi-path signal components from a plurality of antennas (STEP 510). As is known by one of average skill in the art, a transmitted radio frequency signal, because of multi-path interference, among other reasons, will arrive at a specified location as a series of multi-path signal components due to the signal being obstructed and reflected by various structures. Thus, reception may be improved by utilizing a plurality of antennas to receive the multi-path signal components. Thus, the described method includes receiving these multi-path signal components which are separated in timing or phase. Thus, a subsequent step includes phase shifting the non-phase-aligned multi-path signal components to produce phase-aligned signal current components in the form of phase shifted current signals (STEP 514). The method then includes summing the phase shifted current signals to produce an ingoing current signal (STEP 518).

As described before, a phase shift circuit is operably coupled to a high impedance load device. Accordingly, to prompt the output current to flow into a mixer as a current signal, the invention includes providing a low input impedance to prompt the output current to flow into the mixer (STEP 522). In an embodiment that includes cascoded devices at an input stage of the mixer, the invention includes producing the ingoing current signal to a mixing circuit or block, or more generally, to a mixer (STEP 526). Subsequently, the invention includes mixing the ingoing current signal with a local oscillation to produce a phase and frequency shifted ingoing current signal (STEP 530). In each of the above steps starting with STEP 514, all processing has occurred on current signals. Unlike traditional circuits, the phase shift output is not converted to a voltage signal prior to being produced to a mixer. Rather, for a plurality of advantageous reasons, all signals are kept as current signals and the above method is utilized to prompt the current signals to flow into the mixer for frequency shifting or mixing. Similarly, therefore, the phase and frequency shifted signal is produced as a phase and frequency shifted current signal. Thus, the final step of the described method includes providing a virtual ground (by using Transimpedance amplifier) receiving and amplifying the phase and frequency shifted ingoing current signal (STEP 534).

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled".

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention. The embodiments of the invention may also be used in other applications.

The invention claimed is:

1. An integrated circuit radio transceiver, comprising:
 a baseband processor operable to process ingoing digital communication signals and to produce outgoing digital communication signals;
 a transmitter front end operable to process and transmit outgoing RF signals based upon the outgoing digital communication signals; and
 a receiver front end operable to produce the ingoing digital communication signals to the baseband processor based on ingoing RF signals;
 a phase shifter that produces a phase shifted input signal;
 a high impedance load coupled to an output of the phase shifter;
 a low impedance current mixing and amplification stage for generating an amplified frequency shifted output signal to at least a portion of one of the transmitter and receiver front ends, the current mixing and amplification stage further including:
  a current mixer operable to produce a frequency shifted output current signal based upon an oscillation and the phase shifted input signal received from the phase shifter, the current mixer characterized by an output impedance;
  an amplifier block operably disposed to produce an amplified signal based upon the frequency shifted output current signal, the amplifier block further including an amplifier with at least one feedback resistor;
  wherein gain of the amplifier block is based substantially upon a product of a gain characteristic of the current mixer and a resistance value of the at least one feedback resistor; and
  wherein the at least one feedback resistor is coupled directly to an input of the amplifier and to a mixer output of the current mixer.

2. The integrated circuit radio transceiver of claim 1 further comprising a phase shifter operably disposed to produce a phase shifted signal to the current mixer based upon a received ingoing RF signal.

3. The integrated circuit radio transceiver of claim 2 wherein the phase shifted signal is produced to the current mixer of the current mixing and amplification stage and further wherein the current mixer produces a phase and frequency shifted signal based upon the phase shifted signal.

4. The integrated circuit radio transceiver of claim 3 wherein the phase shifter produces the phase shifted signal as a current signal and further wherein an output of a phase shift block is coupled to a high impedance load.

5. The integrated circuit radio transceiver of claim 4 wherein the current mixer comprises a low impedance input to prompt the phase shifted current signal to flow into the current mixer instead of the high impedance load coupled to the output of the phase shift block.

6. An integrated circuit radio receiver, comprising:
a first block operably disposed to receive a signal, wherein the first block produces a phase shifted current signal based upon the signal;
a high impedance load operably disposed to receive the phase shifted current signal from the first block output; and
a second block operably disposed to receive the phase shifted current signal wherein the second block includes input circuitry operably disposed to provide a substantially low input impedance in relation to the high impedance load to prompt the phase shifted current signal to flow into the input circuitry instead of the high impedance load wherein the second block produces a phase and frequency shifted current signal.

7. The integrated circuit radio receiver of claim 6 further comprising an amplifier block coupled to receive and amplify the phase and frequency shifted current signal.

8. The integrated circuit radio receiver of claim 6 wherein the amplifier block comprises an operational amplifier.

9. The integrated circuit radio receiver of claim 6 wherein the first block comprises a phase shift block and the second block comprises a mixer block.

10. The integrated circuit radio receiver of claim 9 further including a mixer bias block operable to provide a bias for the mixer block.

11. The integrated circuit radio receiver of claim 10 further including a second high impedance load operably coupled to an output of the mixer block and the input of the amplifier block.

12. The integrated circuit radio receiver of claim 11 wherein an input impedance of the amplifier block is substantially lower than an impedance of the second high impedance load to prompt the phase and frequency shifted output current signal to flow into the input of the amplifier block.

13. An integrated circuit radio transceiver, comprising:
a baseband processor operable to process ingoing digital communication signals and to produce outgoing digital communication signals;
a transmitter front end operable to process and transmit outgoing RF signals based upon the outgoing digital communication signals; and
a receiver front end operable to receive ingoing RF signals and to process the ingoing RF signals to produce the ingoing digital communication signals to the baseband processor, wherein the receiver front end further includes:
a first block that produces an amplified output current signal into a first high output impedance load;
a second block further including a current mixer that produces a frequency shifted output current signal into a second high output impedance load; and
a third block further including an amplifier for providing an amplified frequency shifted output signal to at least a portion of one of the transmitter and receiver front ends, the third block operably disposed to produce an amplified signal based upon the frequency shifted output current signal, the third block consisting of an amplifier with at least one feedback resistor wherein gain of the third block is based substantially upon a product of a gain characteristic of the current mixer and a resistance value of the at least one feedback resistor and further wherein the at least one feedback resistor is coupled directly to an input of the amplifier and to a mixer output of the second block.

14. The integrated circuit radio transceiver of claim 13 wherein the first block comprises a low noise amplifier operably disposed to produce an amplified signal for mixing with a local oscillation in the current mixer.

15. The integrated circuit radio transceiver of claim 13 wherein the first block comprises a phase shifter operably disposed to produce a phase shifted output to the second block.

16. A method for processing an ingoing RF signal to produce an ingoing digital signal to a baseband processor, comprising:
receiving an RF signal and amplifying the RF signal to produce an amplified RF signal;
phase shifting the amplified RF signal and producing and phase shifted current signal;
mixing the phase shifted current signal with a local oscillation and producing a phase and frequency shifted current signal; and
prompting the frequency shifted current signal to flow into a low impedance input of an amplifier.

17. The method for processing an ingoing RF signal to produce an ingoing digital signal to a baseband processor of claim 16 further including phase shifting the amplified RF signal prior to the mixing step to produce a phase shifted and amplified RF current signal.

18. The method for processing an ingoing RF signal to produce an ingoing digital signal to a baseband processor of claim 17 wherein the step of amplifying the RF signal further includes producing an amplified RF current signal and prompting the amplified RF current signal to flow into a phase shifter for phase shifting in the phase shifting step.

19. The method for processing an ingoing RF signal to produce an ingoing digital signal to a baseband processor of claim 18 further including, at each stage in which an output signal is produced as a current signal, prompting the output signal to not flow into an output load device by providing a high impedance output load device at an output of each stage.

20. The method for processing an ingoing RF signal to produce an ingoing digital signal to a baseband processor of claim 18 further including, at each stage in which an output signal is produced as a current signal, prompting the output signal to not flow into an output load device by providing a subsequent signal processing circuit with a low impedance operably disposed to receive the output signal of each stage in which the output signal is produced as a current signal.

* * * * *